(12) United States Patent
Baumgartner et al.

(10) Patent No.: US 10,474,777 B2
(45) Date of Patent: Nov. 12, 2019

(54) SCALABLE LIVENESS VERIFICATION

(71) Applicant: International Business Machines Corporation, Armonk, NY (US)

(72) Inventors: Jason R. Baumgartner, Travis, TX (US); Pradeep Kumar Nalla, Vemulawada (IN); Raj Kumar Gajavelly, Warangal (IN); Alexander Ivrii, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 66 days.

(21) Appl. No.: 15/806,895

(22) Filed: Nov. 8, 2017

(65) Prior Publication Data

US 2019/0138664 A1    May 9, 2019

(51) Int. Cl.
*G06F 17/50* (2006.01)
(52) U.S. Cl.
CPC .................... *G06F 17/504* (2013.01)
(58) Field of Classification Search
USPC .......................................................... 716/108
See application file for complete search history.

(56) References Cited

U.S. PATENT DOCUMENTS

| 8,352,894 B2 | 1/2013 | Baumgartner et al. |
| 8,627,273 B2 | 1/2014 | Baumgartner et al. |
| 9,471,734 B2 | 10/2016 | Baumgartner et al. |
| 2010/0218150 A1* | 8/2010 | Baumgartner ........ G06F 17/504 716/103 |
| 2010/0223584 A1* | 9/2010 | Baumgartner ...... G06F 17/5031 716/108 |
| 2016/0210389 A1* | 7/2016 | Baumgartner ...... G06F 17/5045 |

(Continued)

OTHER PUBLICATIONS

Biere et al., "Liveness Checking as Safety Checking", International Workshop on Formal Methods for Industrial Critical Systems, Electronic Notes in Theoretical Computer Science 66 No. 2 (2002), <http://www.elsevier.nl/locate/entcs/volume66.html>, 18 pages.

(Continued)

*Primary Examiner* — Mohammed Alam
(74) *Attorney, Agent, or Firm* — Stephen R. Yoder; Gilbert Harmon, Jr.

(57) ABSTRACT

A computer implemented method for increasing scalability in bounded liveness verification includes receiving, by one or more processors, a counterexample trace showing a bounded liveness failure and a set of parameters associated with the counterexample trace, partitioning the counterexample trace into segments representing bound increments contributing to the bounded liveness failure, selecting, by one or more processors, a time interval during which to repeat input values, wherein the selected time interval correlates to one or more segments, evaluating, by one or more processors, the received counterexample after repeating the selected time interval, determining, by one or more processors, whether the evaluation indicates that the counterexample falsifies a deeper bound with respect to a bound or an unbounded liveness counterexample, and, responsive to determining the evaluation indicates that the counterexample falsifies a deeper bound, providing, by one or more processors, counterexample falsification results.

17 Claims, 4 Drawing Sheets

(56) References Cited

U.S. PATENT DOCUMENTS

2017/0010949 A1   1/2017   Baumgartner et al.
2017/0010950 A1   1/2017   Baumgartner et al.

OTHER PUBLICATIONS

Claessen et al., "A Liveness Checking Algorithm that Counts", Proceedings of the 12th Conference on Formal Methods in Computer-Aided Design (FMCAD 2012), © 2012 IEEE, 8 pages.
Nalla et al., "Effective Liveness Verification using a Transformation-Based Framework", 2014 27th International Conference on VLSI Design and 2014 13th International Conference on Embedded Systems, © 2014 IEEE, DOI 10.1109/VLSID.2014.20, 6 pages.
Schuppan, Viktor, "Liveness Checking as Safety Checking to Find Shortest Counterexamples to Linear Time Properties", PhD Thesis, ETH Zurich 2006, 167 pages.

\* cited by examiner

SCALABLE LIVENESS VERIFICATION

BACKGROUND OF THE INVENTION

The present invention relates generally to the field of logic design, and more specifically to increasing efficiency in liveness verification.

Liveness checking refers to the verification of properties of a logic design which are used to assess whether it will "eventually" behave in a correct way. For example, if verifying an arbiter, one may wish to check the property that "every request presented to the arbiter must eventually be granted". Any counterexample (failure trace) to such a property must be of infinite length, showing a request which never receives a grant. Such an infinite-length trace is often represented using a finite-length trace, where some suffix of that trace—denoted by the assertion of a specially-added "LOOP" signal—is highlighted starting at a particular state, and ending with the identical state (or comparable state) about to be repeated. Semantically, this represents an infinite length counterexample since the input behavior of the suffix where LOOP is asserted may be repeated as many times as desired to witness the request-without-grant starvation scenario for an arbitrarily long duration. Liveness checking is in contrast to safety checking, where instead of checking for "eventual good" behavior, one checks if a given signal may ever assert to a given value. It is often the case that safety properties are significantly easier to solve than liveness properties.

SUMMARY

As disclosed herein, a method for increasing scalability in bounded liveness verification includes receiving, by one or more processors, a counterexample trace showing a bounded liveness failure and a set of parameters associated with the counterexample trace, partitioning the counterexample trace into segments representing bound increments contributing to the bounded liveness failure, selecting, by one or more processors, a time interval during which to repeat input values, wherein the selected time interval correlates to one or more segments, evaluating, by one or more processors, the received counterexample after repeating the selected time interval, determining, by one or more processors, whether the evaluation indicates that the counterexample falsifies a deeper bound with respect to a bound or an unbounded liveness counterexample, and, responsive to determining the evaluation indicates that the counterexample falsifies a deeper bound, providing, by one or more processors, counterexample falsification results. A computer program product and a computer system corresponding to the method are also disclosed.

DETAILED DESCRIPTION

Figure 1:
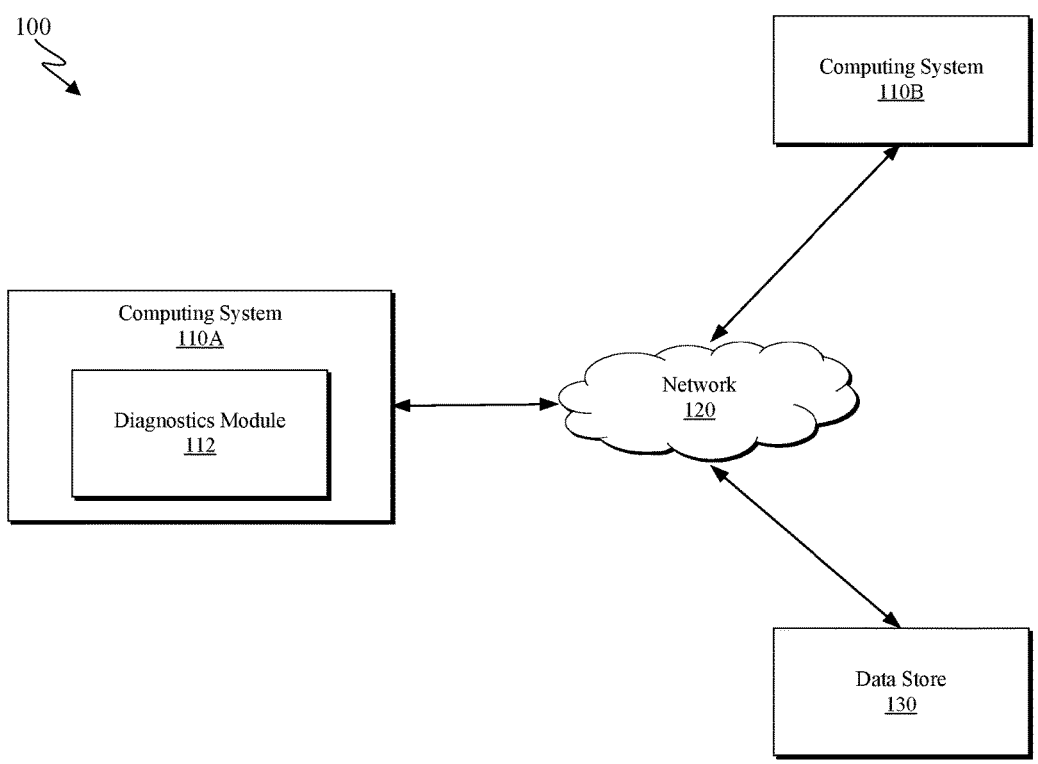
FIG. 1 depicts a bounded liveness verification system in accordance with at least one embodiment of the present invention.

Liveness checks often require the specification of "fairness" conditions, which restrict behavior during the LOOP assertion which may be presented as a property failure. For example, perhaps the arbiter under verification has a skewed priority scheme such that high-priority requests always take precedence over low-priority requests. An infinite sequence of high-priority requests may thus starve out low-priority requests in a correct design. It thus may be required to prevent the reporting of undesired failures where frequent high-priority requests within the LOOP starve out low-priority requests. The occasional absence of high-priority requests may thus be specified as a fairness constraint to eliminate such undesired failures.

One often useful strategy for solving liveness properties is to cast them as bounded liveness properties, which are safety properties. For example, instead of checking "every request presented to the arbiter must eventually be granted" one may check "every request presented to the arbiter must be granted within N time-steps (or N fairness-satisfying occurrences)". A verification tool would then iteratively check from smaller to larger N values. A bounded liveness property is effectively an over-approximation of the original liveness property, since a failure of a bounded liveness property does not mean that the original unbounded liveness property would fail: the bounded liveness property may pass for a larger N. However, a passing bounded liveness property implies that the original property will pass.

For a liveness property that would ultimately pass given enough computational resources to complete this analysis, when verifying a hardware design, there is guaranteed to exist a minimal passing bound N such that the bounded liveness check would fail for smaller N, and will pass for this minimal passing bound. When a bounded liveness check for a particular N value fails, there is also a chance that the resulting trace witnesses a violation of the unbounded liveness property. This can be easily checked by looking for an appropriate state repetition during that trace. However, in practice, it is often the case that bounded liveness counterexamples do not satisfy unbounded liveness failures, at least for smaller bounds. It is furthermore guaranteed that for a failing unbounded liveness property, there will be some bounded liveness check N for which a true unbounded liveness failure can be found.

In the worst case, this value of N for which a bounded liveness check yields a proof, or valid unbounded failure, may be exponentially large compared to the number of state elements of a design. It usually is much smaller, however. The chance that a failing bounded liveness check yields a true unbounded liveness failure is largely a matter of luck, especially for smaller bounds.

Since in the worst case this minimal passing bound value may be impractically large, bounded liveness checking is sometimes but not always more scalable than unbounded liveness checking. Though, one major benefit of bounded liveness checking is for designs with memory arrays (RAM): unbounded liveness checking algorithms often require the RAM to be modeled as individual state variables so that a state repetition can be modeled and checked, whereas with bounded liveness checking the RAM can be retained in native form for the resulting safety property check, often enabling greater scalability in a subsequent algorithms.

Another scalability challenge for bounded liveness checking is that determining a minimal passing bound often requires significant effort. If such a minimal N is relatively large, an approach of iteratively checking N=1, N=2, . . . requires significant effort to converge on the minimal passing bound, obtaining a series of increasingly long bounded liveness counterexamples each of which may require significant computation resources to compute. If one attempts to check N in larger increments, e.g. N=10, N=20—there is a risk that a proof is attempted on a much larger bound than would ultimately pass, causing significant verification capacity degradation, since the larger N, the larger generally will be the computational resources required to prove the resulting bounded livelock property.

The present invention provides improvement to the state-of-the-art in bounded liveness checking. The particular invention consists of a method to analyze and manipulate a bounded liveness counterexample to one that is significantly more likely to exhibit a counterexample to a deeper bound, and even to a true unbounded liveness counterexample. This invention thereby can greatly accelerate falsification of liveness properties which will ultimately fail, by enabling them to be found using simpler bounded liveness properties. It also accelerates liveness verification proofs, by more quickly converging to a minimal passing bound with fewer irrelevant bounds checked.

The present invention will now be described in detail with reference to the Figures. Implementation of embodiments of the invention may take a variety of forms, and exemplary implementation details are discussed subsequently with reference to the Figures.

FIG. 1 depicts a bounded liveness verification system 100 in accordance with at least one embodiment of the present invention. As depicted, bounded liveness verification system 100 includes computing systems 110, a network 120, and a data store 130. While the depicted embodiment of bounded liveness verification system 100 includes two separate computing systems 110 and a standalone data store 130 all connected by network 120, it should be appreciated that the functions of the two computing systems 110 and the data store 130 may be carried out by a single computing system in additional (not pictured) embodiments. Bounded liveness verification system 100 is simply one possible arrangement of a system capable of executing the methods disclosed herein.

Each of computing systems 110 can be a desktop computer, laptop computer, specialized computer server, or any other computer system known in the art. In some embodiments, computing system 110 represents a computer system utilizing clustered computers and components to act as a single pool of seamless resources. In general, computing system 110 is representative of any electronic device, or combinations of electronic devices, capable of executing machine-readable program instructions, as described in greater detail with regard to FIG. 4.

As depicted, computing system 110 hosts a diagnostics module 112. Diagnostics module 112 may be configured to receive bounded liveness check parameters from computing system 110B or data store 130. In some embodiments, diagnostics module 112 is configured to execute a bounded liveness extension method. One example of an appropriate bounded liveness extension method is discussed with respect to FIG. 2 below. Diagnostics module 112 may additionally be configured to execute a bounded livelock input selection method. An example of an appropriate bounded livelock input selection method is discussed with respect to FIG. 3 below.

Network 120 can be, for example, a local area network (LAN), a wide area network (WAN) such as the Internet, or a combination of the two, and include wired, wireless, or fiber optic connections. In general, network 120 can be any combination of connections and protocols that will support communications between computing systems 110 in accordance with an embodiment of the present invention. In at least one embodiment of the present invention, network 120 facilitates data transmissions between computing systems 110 and data store 130.

Data store 130 may be any non-volatile storage media known in the art. For example, data store 130 can be implemented with a tape library, optical library, one or more independent hard disk drives, or multiple hard disk drives in a redundant array of independent disks (RAID). Similarly, data in data store 130 may conform to any suitable storage architecture known in the art, such as a file, a relational database, an object-oriented database, and/or one or more tables. With respect to the depicted embodiment, data store 130 is configured to receive bounded liveness trace parameters and results from computing systems 110 via network 130.

A netlist, as used herein, contains a finite directed graph with vertices representing gates, and edges representing interconnections between those gates. The gates have associated functions, such as constants, primary inputs, combinational logic such as AND gates, and sequential elements hereafter referred to as registers. Registers have two associated components: their next-state functions, and their initial-value functions. Both are represented as other gates in the graph. Semantically, for a given register, the value appearing at its initial-value gate at time "0" ("initialization" or "reset" time) will be applied as the value of the register itself; the value appearing at its next-state function gate at time "i" will be applied to the register itself at time "i+1". A set of valuations to all registers in a netlist is called a "state". Certain gates are labeled "safety targets" or "liveness". Safety targets correlate to safety properties, where the goal of the verification process is to find a way to drive a "1" to the corresponding gate, or to prove that no such assertion is possible. Whereas liveness gates correlate to liveness properties, where the verification goal is to demonstrate that the liveness gate may be held at '1' forever, or to prove that the liveness gate cannot stay at value 1 forever. Checking liveness properties is often done by looking for a state repetition within which the liveness gate remains asserted, and thus can be infinitely repeated. Liveness properties often require specification of "fairness gates"—which must assert at least once within a failing state repetition. If a violation of a property gate of either type is computed, the verification tool must generate a "counterexample trace" (a waveform, showing Boolean values to gates over time) illustrating the violating scenario.

When verifying bounded liveness, instead of looking for a state repetition to constitute a liveness counterexample, one checks whether repeated assertions of the liveness gate and fairness gates can be witnessed. Without fairness, this is a straight-forward process of adding a counter to the netlist, counting how many consecutive timesteps the liveness gate can remain asserted for—and failing if this count reaches some bound N. The process of counting "fairness gates assertions" is nontrivial. It is not adequate to count how many times each of the fairness gates asserted since the livelock gate asserted, since the requirement is that each fairness assert within what may constitute a repeatable loop of netlist behavior. In other words, the various fairness gates must each have been asserted within some "fairness-satisfying time-window" to be able to contribute meaningfully to a bounded livelock check. An algorithm to synthesize a bounded livelock check with fairness in this optimized way is provided in Algorithm 1, also called a bounded livelock synthesis algorithm below.

1. For each liveness gate live_j
2. Create a new register fair_seen_ij for each fairness gate fair_i, initialized to 0
3. Define fair_seen_ij_temp=if(NOT(live_j)) then 0 else if(fair_i) then 1
   else fair_seen_ij. Define fair_seen_ij_next=if(all_fair_j) then 0 else fair_seen_ij_temp. Set next-state function of fair_seen_ij to fair_seen_ij_next
4. Define all_fair_j as the conjunction of each fair_seen_ij_temp
5. Add a counter to the netlist, initialized to 0 and resetting to 0 when live_j deasserts, otherwise counting assertions of all_fair_j.
6. Convert unbounded livelock gate live__j to a bounded livelock gate bounded_jN, checking if a next-state of the counter from step 5 equals a particular value of N.

Note in Algorithm 1 that each synthesized fair_seen_ij will assert to indicate that fair_ij was asserted since livelock gate live__j became asserted, and will be cleared as soon as every fairness gate has been asserted (i.e., all_fair_j is asserted). Each all_fair_j assertion increments the bounded liveness counter for live_j, and this counter will then wait for another assertion of each of the fairness to increment again. Thus for a netlist with 2 fairness gates, and a trace where fair__1 asserts for multiple timesteps during which fair_2 remains deasserted, then fair_2 asserts for multiple timesteps during which fair__1 remains deasserted, the bounded liveness counter would only increment once regardless of how long each individual fairness gate remained asserted. The trace therefore would only exhibit one potential occurrence of a behavior loop which could constitute a liveness failure wherein all fairness gates assert. It is only when each other fairness gates has asserted, since the last assertion of a particular fairness gate, that there is an additional "stand-alone" candidate behavior loop that could potentially constitute a liveness failure. Ideally, bounded liveness checking will count such candidate loops directly and minimally. Algorithm 1 detects a trace exhibiting exactly N potential livelock loop occurrences in as few timesteps as possible.

Algorithm 1 has one drawback, however: if the netlist has multiple liveness and fairness gates, Algorithm 1 will introduce one register per liveness gate multiplied by the number of fairness gates. This may result in a much larger netlist than possible to implement bounded liveness checks for each original unbounded liveness gate, which may significantly degrade the performance of the verification tool. An alternate algorithm is provided in Algorithm 2, also called the Improved Bounded Livelock Synthesis Algorithm, which introduces only one register per liveness gate plus one per fairness gate.

1. Create a new input variable "loop_check"
2. Create a new register fair_seen_i for each fairness gate fair_i, initialized to 0
3. Define fair_seen_i_temp=if(NOT(loop_check)) then 0 else if(fair_i) then 1, else fair_seen_i. Define fair_seen_i_next=if(all_fair) then 0 else fair_seen_i_temp. Set next-state function of fair_seen_i to fair_seen_i_next
4. Define all_fair as the conjunction of each fair_seen_i_temp.
5. Create a new register live_ok_j for each livelock gate live_j, initialized to 0 and whose next-state function is live_ok_j or (NOT(live_j) & (OR(fair_seen_*_next)))
6. Add a counter to the netlist, initialized to 0 and resetting to 0 when the next-state function of live_ok_j is asserted, otherwise counting assertions of all_fair
7. Convert unbounded livelock gate live_j to a bounded livelock gate (safety property) bounded_jN, checking if the next-state of the counter from step 5 equals a particular value of N.

Algorithm 2 modifies Algorithm 1 in that only a single register per fairness gate is created that can be used across all livelock gates. This register thus does not deassert if any particular livelock gate live_j is deasserted—but instead deasserts if a new input variable loop_check deasserts. loop_check will also permanently assert register live_ok_j if any fair_seen_i_next asserts when live_j is deasserted, thereby avoiding potentially incrementing a bounded liveness count prematurely. Since "loop_check" is an input variable which can clear fair_seen_i_next, this enables a verification algorithm to explore traces that assert loop_check only when a particular live_j gate is asserted, and thus capture all possible counterexamples.

Finally, assertions of all_fair__j are counted only if live_ok_j remains deasserted. The live_ok_j registers thus avoid cases where the fair_seen registers start counting fairness assertions prematurely relative to any particular livelock gate live_j.

Figure 2:
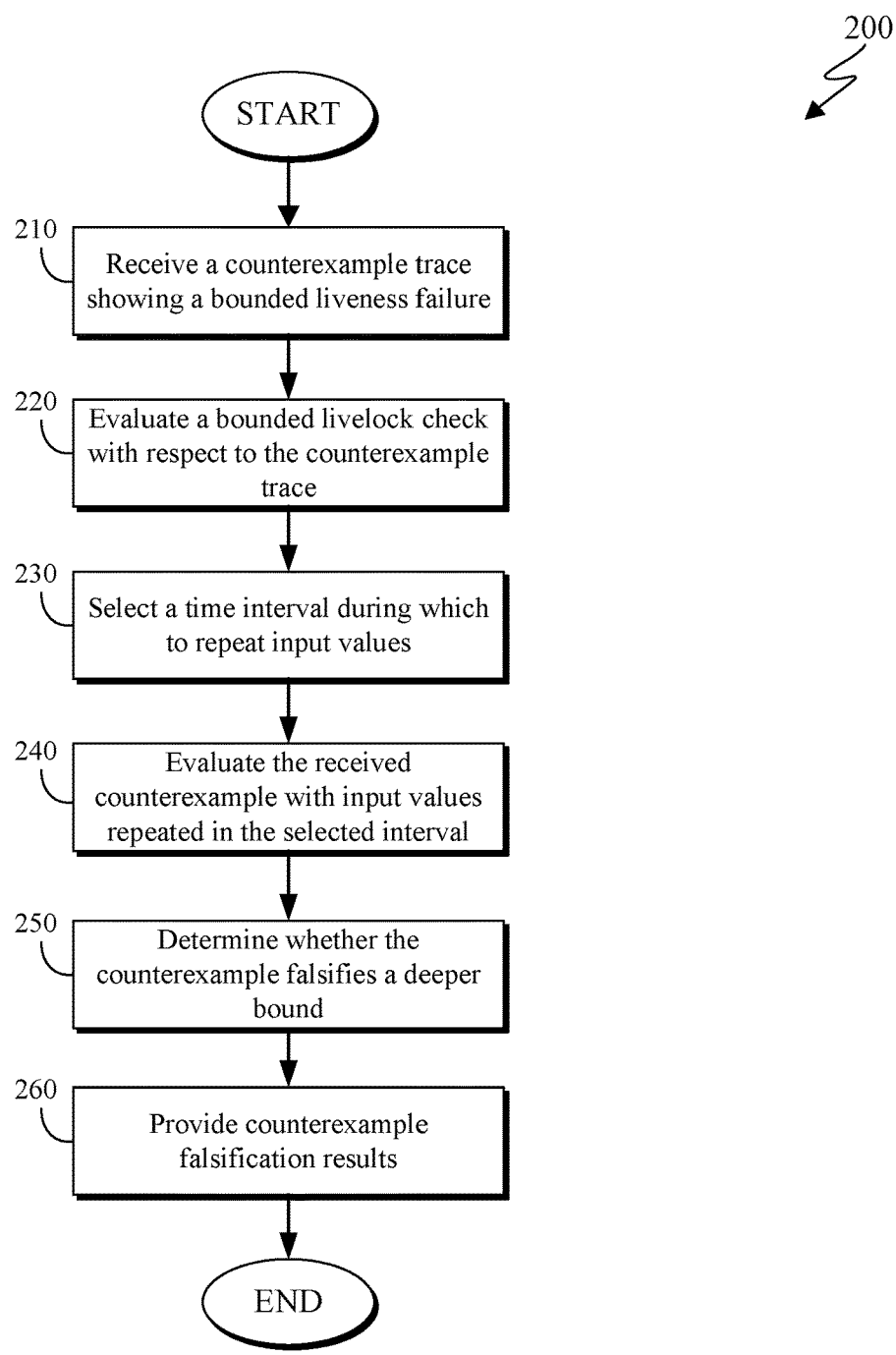
FIG. 2 is a flowchart depicting a bounded liveness extension method in accordance with at least one embodiment of the present invention.

FIG. 2 is a flowchart depicting a bounded liveness extension method 200 in accordance with at least one embodiment of the present invention. As depicted, bounded liveness extension method 200 includes receiving (210) a counterexample trace showing a bounded liveness failure, synthesizing (220) a bounded livelock check with optimized fairness, selecting (230) a time interval during which to repeat input values, wherein the selected time interval occurs after a first point at which a livelock asserts, evaluating (240) the received counterexample with input values repeated within the selected time interval, determining (250) whether the evaluation indicates that the counterexample falsifies a deeper bound with respect to a bound, and providing (260) counterexample falsification results.

Receiving (210) a counterexample trace showing a bounded liveness failure may include receiving one or more parameters under which a counterexample trace exhibits a bounded liveness failure. In some embodiments, the received parameters include at least a bound N under which the counterexample trace exhibits bounded liveness failure. The received parameters may additionally include an indication of a livelock gate J which exhibits the bounded liveness failure.

Evaluating (220) a bounded livelock check with respect to the received counterexample trace may include executing a bounded livelock synthesis algorithm to create a bounded livelock check. In some embodiments, algorithm 1 as discussed above may be used to synthesize a bounded livelock check with optimized fairness. In other embodiments, algorithm 2 as discussed above may be used to synthesize a bounded livelock check with optimized fairness. For example, synthesizing (220) a bounded livelock check with optimized fairness may include executing algorithm 2 for a value live_j under the counterexample trace setting "loop_check." Said example may additionally include confirming the result of algorithm 2 for live_j is equivalent to the value of live_j. Synthesizing (220) a bounded livelock check with optimized fairness may further include receiving a set of one or more parameters with respect to which the bounded livelock check is to be optimized. In some embodiments, synthesizing (220) a bounded livelock check with optimized fairness includes simply receiving an already synthesized bounded livelock check with optimized fairness. Synthesizing (220) the bounded livelock check corresponds to a preferred embodiment, but any method of evaluating the bounded livelock check's validity may be used in various other embodiments.

Selecting (230) a time interval during which to repeat input values may include identifying a time interval according to one or more selected conditions. In at least one embodiment, the selected time interval is selected such that it occurs after a first point at which the livelock J asserts. Consider an embodiment where f1 . . . fN represent the timeframes at which all_fair_j asserts, and f0 represents a first timestep where live_j asserts. Selecting (230) a time interval may include choosing a window ti . . . tj where f0≤ti<tj≤fN in which to repeat input values starting at time tj+1. An alternative time interval selection process is discussed with respect to FIG. 3 below.

Evaluating (240) the received counterexample during the selected time interval may include providing evaluation parameters based on the synthesized bounded livelock check and the selected time interval to provide an updated evaluation. In at least some embodiments, evaluating (240) the received counterexample includes conducting a simulation of the counterexample where input values are repeated during the previously selected time interval. Evaluating (240) the received counterexample during the selected time interval includes providing updated simulation results based on the provided simulation parameters.

Determining (250) whether the updated evaluation results indicate that the counterexample falsifies a deeper bound with respect to bound N may include identifying the bound O of the updated evaluation. This step may also generally be used to determine that an unbounded livelock counterexample has been detected, in which the liveness verification problem has been solved. Determining (250) whether the updated evaluation results indicate that the counterexample falsifies a deeper bound may additionally include comparing the bound O of the updated evaluation to the previous bound N. If O>N, it is evident that the updated evaluation based on the received parameters falsifies a deeper bound than the initial evaluation based on the original parameters. If O≤N, it is evident that the updated evaluation based on the received parameters does not falsify a deeper bound than the initial evaluation based on the original parameters.

Providing (260) counterexample falsification results may include generating a report including the results of the updated evaluation. In some embodiments, the generated report may include the initial evaluation parameters as well as the initial simulated bound N for the counter example. The generated report may additionally include the updated evaluation parameters, such as the time interval during which input values are repeated and the deeper bound O. In some embodiments, the generated report may include an indication of whether or not the updated evaluation falsified a deeper bound. If the updated evaluation yields an unbounded livelock counterexample, the report may include an indication that the updated evaluation and corresponding parameters constitute an unbounded livelock counterexample.

In some embodiments, the method may additionally comprise casting a bounded liveness checking problem for a given bound N to arbitrary solving engines, and obtaining a proof or a bounded liveness counterexample from the solving engine. The method may continue by analyzing the bounded liveness counterexample or the proof to provide a conclusive verification result for the unbounded liveness property. Responsive to determining the liveness counterexample does not represent an unbounded liveness counterexample, the method concludes by extending this bounded liveness counterexample for bound N to a deeper bound O>N. This may further improve the performance of the liveness verification process by casting a bounded liveness checking problem for bound O+1, instead of N+1, in the next iteration of this method, which more quickly converges to a minimal provable bound or an unbounded livelock counterexample.

Note that there is nothing inherent in the bounded livelock specification which restricts input behavior after adequate causality has been established to falsify a given bound. I.e., netlists are sequential, and a given input valuation may influence a given gate arbitrarily later in a trace. The values of inputs toward the final timesteps of a trace are thus more likely to be irrelevant to a given failure. For this reason, intuitively, it is often useful to select tj earlier than fN. However, there is nothing that guarantees that any particular livelock increment window is valuable to repeat. Intuitively, it seems likely that the first several windows may exhibit different input values less relevant to later windows: for deeper bounds, it seems more likely that eventually the netlist settles into more of a repeating state sequence for which repeated inputs may be more successful to yield a deeper bounded fail.

Given the heuristic nature of this process, certain approaches can only bring benefit if there is some repeatable input behavior within a bounded livelock counterexample which can yield a deeper failing livelock bound; if the input values within each iteration must differ from those for deeper iterations, this approach is likely to fail, at least for the given bounded liveness counterexample. Seeking qualitatively different input behaviors from those exhibited in a particular counterexample is resolved by seeking a bounded livelock failure for a larger bound, which is closer to a true livelock counterexample and which is more amenable to these techniques.

Figure 3:
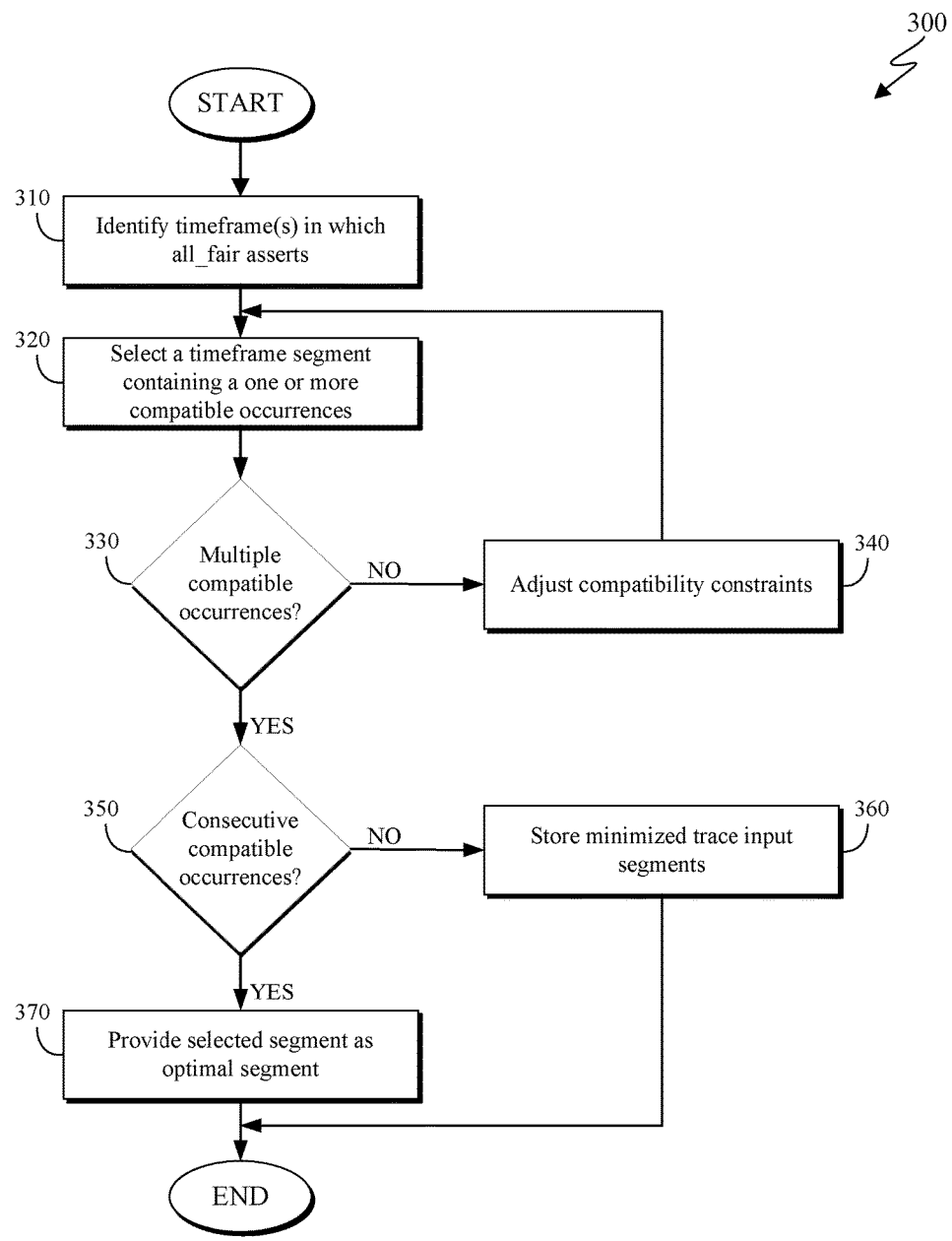
FIG. 3 is a flowchart depicting a bounded livelock input selection method in accordance with at least one embodiment of the present invention.

FIG. 3 is a flowchart depicting a bounded livelock input selection method 300 in accordance with at least one embodiment of the present invention. As depicted, bounded livelock input selection method 300 includes identifying (310) one or more timeframes in which all_fair asserts with respect to a given counterexample, selecting (320) a segment of the bounded counterexample timeframe with a largest number of compatible occurrences, determining (330) whether the selected segment has multiple compatible occurrences, adjusting (340) compatibility constraints, determining (350) whether a segment has multiple consecutive compatible occurrences, storing (360) minimized input segments, and providing (370) the selected segment.

Identifying (310) one or more timeframes in which all_fair asserts with respect to a given counterexample may include analyzing all_fair results for one or more timeframes and determining which timeframes all_fair asserts in. Let f1 . . . fN represent the timeframes at which all_fair asserts in this counterexample. Let f0 be the first timestep where live_j asserts. Let d0 . . . d{N−1} represent f{i+1}−f{i}, sometimes referred to as "segments" of the bounded livelock counterexample.

Selecting (320) a segment of the bounded counterexample timeframe with a largest number of compatible occurrences may include analyzing the segments of the identified timeframes to identify a number of compatible occurrences in the segments. In one embodiment, selecting (320) a segment includes identifying the di which has the largest number of "compatible" occurrences. "Compatible" can either be (a) a very fast comparison of the length of di alone, or can be implemented by (b) checking equivalent input valuation sequences witnessed in the counterexample within this window, or (c) using a minimized trace to identify and ignore any non-essential input valuations first. Generally, the length-only check is most relaxed (i.e. more likely to yield matches) than the check of minimized input valuation sequences, which is more relaxed than the check of exact input valuation sequences.

Determining (330) whether the selected segment has multiple compatible occurrences may include analyzing a segment with respect to a current compatibility constraint to identify one or more compatible occurrences. If the selected segment has multiple compatible occurrences (330, yes branch), a preferred embodiment will consider the one with the highest occurrence count, breaking ties to the one which occur earliest in the trace. If every segment ($d_j$) between the first and last compatible occurrence are compatible, a preferred embodiment will return ti as the beginning of the first compatible occurrence, and tj as the end of the last compatible occurrence. Otherwise, a preferred embodiment will check whether the first selected compatible occurrence concatenated with the second has multiple compatible occurrences and if so return ti as the beginning of the first compatible occurrence, and tj as the end of the last compatible occurrence. A preferred emdodiment will repeat this concatenation compatibility check until continued concatenation yields no multiple occurrences.

If no segment has multiple compatible occurrences (330, no branch), the method continues by adjusting (340) compatibility constraints. Adjusting (340) compatibility constraints may include redefining compatibility to have less strict constraints. For example, if compatibility had initially been analyzed with respect to exact input valuation sequences, adjusting (340) the compatibility constraints may include switching compatibility to be defined by minimized input valuation sequences or by length-only. If this yields no compatible occurrences, a preferred embodiment will further relax compatibility constraints by requiring only a percent of input valuations to be identical, or length to be identical modulo a small delta.

Determining (350) whether a segment has multiple consecutive compatible occurrences may include analyzing adjacent occurrences to the selected segment to determine whether one or more adjacent occurrences are compatible. If the segment has multiple consecutive compatible occurrences, (350, yes branch), the method continues by providing (370) the selected segment as optimal output. If the segment does not have multiple consecutive compatible occurrences (350, no branch), the method continues by storing (360) the minimized trace input segments.

Storing (360) minimized input segments may include sending the minimized trace input segments to a storage architecture. In at least one embodiment, the minimized trace input segments may be stored to be applied across different bounded livelock counterexamples for differing N's. The minimized input segments may also be used to return the position of those that appear most often across different counterexamples.

Providing (370) the selected segment as an optimal time segment during which to repeat input values may include returning ti and di as the beginning of a first compatible occurrence, and tj as the beginning of the last compatible occurrence. In some embodiments where multiple compatible di's are found which are not consecutive, providing (370) the selected segment as an optimal time segment during which to repeat input values includes returning ti and di as the beginning of the first compatible occurrence, and tj as the beginning of the last compatible occurrence. The selected segment may correspond to a sliding segment ti=f{c1} and tj=f{N−c2}, where c1 and c2 are algorithm parameters where c1<N−C2<=N. In this way, as N increases, segments are selected from the middle of its bounded livelock repetition window which are more likely to result in repetition of the pending livelock behavior under analysis.

There is a possibility that consecutive segments are all of differing lengths. For example, perhaps the second and third window are of length 6, and the fourth and fifth are of length 3. In this case, it is possibly more accurate to consider the second and third segment as a single longer segment, against which segment four and five may match. If no such consecutive compatible segments are found, the bounded livelock counterexample may not be in ideal form—perhaps a byproduct of the algorithms used to compute it. This is part of the motivation of retaining a dictionary of segments across different bounded liveness counterexamples; as more counterexamples are found for increasing N, the chance of identifying a compatible segment increases.

It is also noteworthy that the computational requirements of evaluation are quite small, compared to potentially very large resources to compute a bounded livelock counterexample in the first place. In practice, it is often effective to try several reevaluation schemes per counterexample until one is found which increases the falsified bound to the greatest degree, or yields an unbounded livelock counterexample. If that deeper bounded counterexample is not an unbounded counterexample, and if heavier analysis is desired to try to obtain an unbounded counterexample, using the resimulated trace of greatest depth is often more likely to yield a conclusive result.

In many instances, it may be beneficial to execute a verification method to confirm the validity of a bounded livelock. Algorithm 5, or an accelerated bounded livelock checking method, is a verification method as follows:

1. For each livelock gate live_j, select a starting bound jN and create a bounded livelock gate (safety property) bounded_jN using Algorithm 2
2. Perform verification on the bounded_jN safety property gates
3. If any of the bounded_jN safety property gates are proven as unassertable, report the corresponding livelock property as proven correct
4. If a bounded livelock counterexample is obtained for bounded_jN, use FIG. 2 to determine the deepest bound jM>jN that can be found for this trace
5. Check whether the resulting deepest-bound trace from step 4 constitutes an unbounded livelock counterexample. If so, return this as a failure for live__j
6. Determine if an unbounded livelock can be found using this deepest-bound trace from step 4. If an unbounded livelock counterexample is found, return this as a failure for live__j
7. Create livelock gate bounded_j{M+1} for live__j and repeat step 2 Algorithm 5 may be used to verify that the bounded livelock is indeed valid using the parameters provided.

Figure 4:
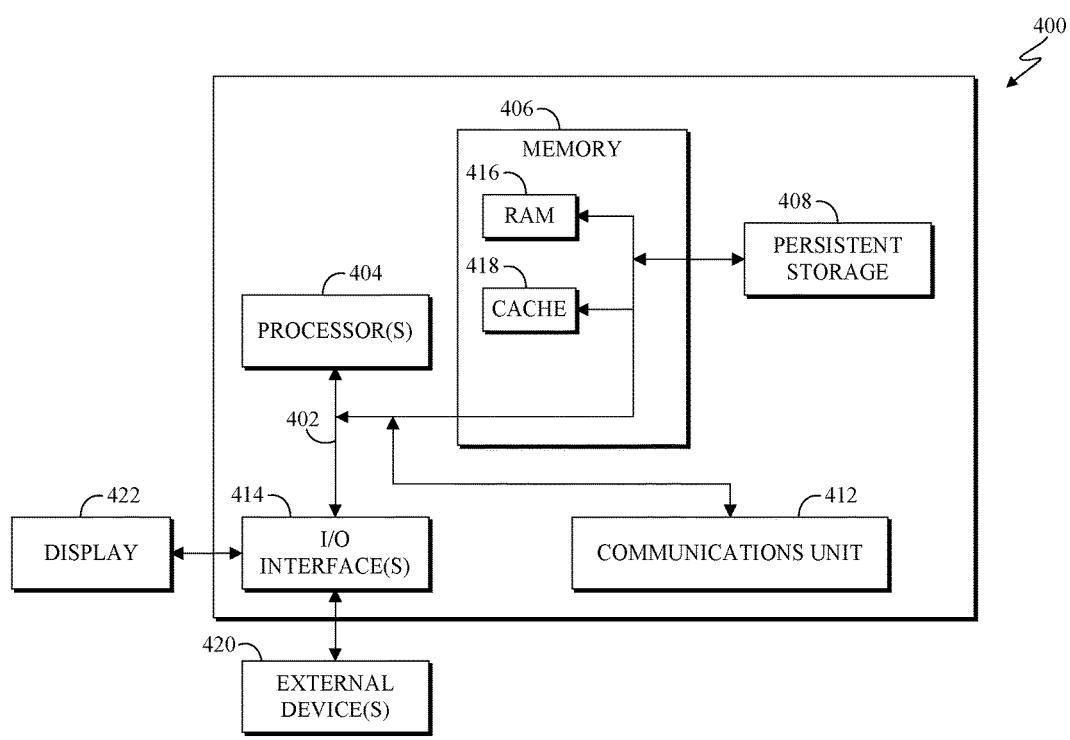
FIG. 4 depicts a block diagram of components of a computer, in accordance with some embodiments of the present invention.

FIG. 4 depicts a block diagram of components of computer 500 in accordance with an illustrative embodiment of the present invention. It should be appreciated that FIG. 5 provides only an illustration of one implementation and does not imply any limitations with regard to the environments in which different embodiments may be implemented. Many modifications to the depicted environment may be made.

As depicted, the computer 400 includes communications fabric 402, which provides communications between computer processor(s) 404, memory 406, persistent storage 408, communications unit 412, and input/output (I/O) interface(s) 414. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses.

Memory 406 and persistent storage 408 are computer-readable storage media. In this embodiment, memory 406 includes random access memory (RAM) 416 and cache memory 418. In general, memory 406 can include any suitable volatile or non-volatile computer-readable storage media.

One or more programs may be stored in persistent storage 408 for access and/or execution by one or more of the respective computer processors 404 via one or more memories of memory 406. In this embodiment, persistent storage 408 includes a magnetic hard disk drive. Alternatively, or in addition to a magnetic hard disk drive, persistent storage 408 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer-readable storage medium that is also part of persistent storage 408.

Communications unit 412, in these examples, provides for communications with other data processing systems or devices. In these examples, communications unit 412 includes one or more network interface cards. Communications unit 412 may provide communications through the use of either or both physical and wireless communications links.

I/O interface(s) 414 allows for input and output of data with other devices that may be connected to computer 400. For example, I/O interface 414 may provide a connection to external devices 420 such as a keyboard, keypad, a touch screen, and/or some other suitable input device. External devices 420 can also include portable computer-readable storage media such as, for example, thumb drives, portable optical or magnetic disks, and memory cards. Software and data used to practice embodiments of the present invention can be stored on such portable computer-readable storage media and can be loaded onto persistent storage 408 via I/O interface(s) 414. I/O interface(s) 414 also connect to a display 422.

Display 422 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer implemented method for increasing scalability in bounded liveness verification, the method comprising:
   receiving, by one or more processors, a counterexample trace showing a bounded liveness failure and a set of parameters associated with the counterexample trace, wherein a counterexample trace refers to a finite length trace, and wherein bounded liveness refers to a group of traces;
   partitioning the counterexample trace into segments representing bound increments contributing to the bounded liveness failure;
   synthesizing or otherwise modeling a bounded livelock with optionally one or more fairness constraints whose behavior is evaluated relative to received counterexample;
   identifying a time interval in which the bounded livelock model indicates progress toward a bounded livelock failure with respect to the received counterexample trace;
   selecting a segment of the identified time interval which is compatible with one or more adjacent segments during which to repeat input values;
   evaluating, by one or more processors, the received counterexample after repeating the selected segment;
   determining, by one or more processors, whether the evaluation indicates that the counterexample falsifies a deeper bound with respect to a bounded or an unbounded liveness counterexample; and
   responsive to determining the evaluation indicates that the counterexample falsifies a deeper bound, providing, by one or more processors, counterexample falsification results.

2. The computer implemented method of claim 1, wherein segment compatibility is based on the length of the segments.

3. The computer implemented method of claim 1, wherein segment compatibility is based on input valuation equivalence.

4. The computer implemented method of claim 1, wherein the received set of parameters includes a bound N under which the counterexample trace exhibits a bounded liveness failure.

5. The computer implemented method of claim 1, further comprising validating the provided counterexample falsification results, wherein the counterexample falsification results correspond to an extended bound.

6. The computer implemented method of claim 1, further comprising:
   casting a bounded liveness checking problem for a given bound N to arbitrary solving engines;
   obtaining a proof or a bounded liveness counterexample from the solving engines;
   analyzing the bounded liveness counterexample or the proof to provide a conclusive verification result for the unbounded liveness property; and
   responsive to determining the liveness counterexample does not represent an unbounded liveness counterexample, extending this bounded liveness counterexample for bound N to a deeper bound O>N.

7. The computer implemented method of claim 1, wherein evaluating the received counterexample after repeating the selected time interval includes simulating the received counterexample to provide simulation results.

8. A computer program product increasing scalability in bounded liveness verification, the computer program product comprising:

one or more computer readable storage media and program instructions stored on the one or more computer readable storage media, the program instructions comprising instructions to:

receive, by one or more processors, a counterexample trace showing a bounded liveness failure and a set of parameters associated with the counterexample trace, wherein a counterexample trace refers to a finite length trace, and wherein bounded liveness refers to a group of traces;

partition the counterexample trace into segments representing bound increments contributing to the bounded liveness failure;

synthesize or otherwise modeling a bounded livelock with optionally one or more fairness constraints whose behavior is evaluated relative to received counterexample;

identify a time interval in which the bounded livelock model indicates progress toward a bounded livelock failure with respect to the received counterexample trace;

select a segment of the identified time interval which is compatible with one or more adjacent segments during which to repeat input values;

evaluate, by one or more processors, the received counterexample after repeating the selected segment;

determine, by one or more processors, whether the evaluation indicates that the counterexample falsifies a deeper bound with respect to a bound or an unbounded liveness counterexample; and responsive to determining the evaluation indicates that the counterexample falsifies a deeper bound, provide, by one or more processors, counterexample falsification results.

9. The computer program product of claim 8, wherein segment compatibility is based on the length of the segments.

10. The computer program product of claim 8, wherein segment compatibility is based on input valuation equivalence.

11. The computer program product of claim 8, wherein the received set of parameters includes a bound N under which the counterexample trace exhibits a bounded liveness failure.

12. The computer program product of claim 8, further comprising instructions to validate the provided counterexample falsification results, wherein the counterexample falsification results correspond to an extended bound.

13. A computer system for ranking devices according to compatibility with a service, the computer program product comprising:

one or more computer processors;

one or more computer readable storage media;

program instructions stored on the one or more computer readable storage media, the program instructions comprising instructions to:

receive, by one or more processors, a counterexample trace showing a bounded liveness failure and a set of parameters associated with the counterexample trace, wherein a counterexample trace refers to a finite length trace, and wherein bounded liveness refers to a group of traces;

partition the counterexample trace into segments representing bound increments contributing to the bounded liveness failure;

synthesize or otherwise modeling a bounded livelock with optionally one or more fairness constraints whose behavior is evaluated relative to received counterexample;

identify a time interval in which the bounded livelock model indicates progress toward a bounded livelock failure with respect to the received counterexample trace;

select a segment of the identified time interval which is compatible with one or more adjacent segments during which to repeat input values;

evaluate, by one or more processors, the received counterexample after repeating the selected segment;

determine, by one or more processors, whether the evaluation indicates that the counterexample falsifies a deeper bound with respect to a bound or an unbounded liveness counterexample; and responsive to determining the evaluation indicates that the counterexample falsifies a deeper bound, provide, by one or more processors, counterexample falsification results.

14. The computer system of claim 13, wherein segment compatibility is based on the length of the segments.

15. The computer system of claim 13, wherein segment compatibility is based on input valuation equivalence.

16. The computer system of claim 13, wherein the received set of parameters includes a bound N under which the counterexample trace exhibits a bounded liveness failure.

17. The computer system of claim 13, further comprising instructions to validate the provided counterexample falsification results, wherein the counterexample falsification results correspond to an extended bound.

* * * * *